(12) United States Patent
Lee et al.

(10) Patent No.: US 11,811,413 B2
(45) Date of Patent: Nov. 7, 2023

(54) POLY PHASE FILTER WITH PHASE ERROR ENHANCE TECHNIQUE

(71) Applicant: MEDIATEK INC., Hsin-Chu (TW)

(72) Inventors: Fong-Wen Lee, Hsinchu (TW); Wen-Chieh Wang, Hsinchu (TW); Yu-Hsin Lin, Hsinchu (TW)

(73) Assignee: MEDIATEK INC., Hsin-Chu (TW)

(*) Notice: Subject to any disclaimer, the term of this patent is extended or adjusted under 35 U.S.C. 154(b) by 0 days.

(21) Appl. No.: 17/864,416

(22) Filed: Jul. 14, 2022

(65) Prior Publication Data
US 2023/0114343 A1 Apr. 13, 2023

Related U.S. Application Data

(60) Provisional application No. 63/255,029, filed on Oct. 13, 2021.

(51) Int. Cl.
*H03K 5/135* (2006.01)
*H03K 5/14* (2014.01)
*H03L 7/085* (2006.01)

(52) U.S. Cl.
CPC ............... *H03K 5/135* (2013.01); *H03K 5/14* (2013.01); *H03L 7/085* (2013.01)

(58) Field of Classification Search
None
See application file for complete search history.

(56) References Cited

U.S. PATENT DOCUMENTS

| 6,768,364 B2* | 7/2004 | Wang ........................ H03H 7/21 331/137 |
| 7,397,317 B2* | 7/2008 | Park ........................ H03B 27/00 331/137 |
| 9,036,390 B2* | 5/2015 | Kitsunezuka .......... H03D 7/163 455/302 |

(Continued)

FOREIGN PATENT DOCUMENTS

| EP | 3 419 166 A1 | 12/2018 |
| WO | 92/11704 A1 | 7/1992 |

OTHER PUBLICATIONS

Farshad Piri et al., A PVT-Tolerant >40-dB IRR, 44% Fractional-Bandwidth Ultra-Wideband mm-Wave Quadrature LO Generator for 5G Networks in 55-nm CMOS, IEEE Journal of Solid-State Circuits, Dec. 2018, pp. 3576-3586, vol. 53, No. 12, IEEE, XP011701017, Dec. 2018.

*Primary Examiner* — Cassandra F Cox
(74) *Attorney, Agent, or Firm* — Winston Hsu

(57) ABSTRACT

The present invention provides a filtering circuit comprising a poly phase filter and a quadrature phase detector. The poly phase filter comprises a first path, a second path, a third path and a fourth path. The first path is configured to receive a first input signal to generate a first clock signal. The second path comprising a first adjustable delay circuit is configured to receive the first input signal to generate a second clock signal. The third path comprising a second adjustable delay circuit is configured to receive a second input signal to generate a third clock signal. The fourth path is configured to receive the second input signal to generate a fourth clock signal. The quadrature phase detector is configured to detect phases of these clock signals to generate control signals to control the first adjustable delay circuit and the second adjustable delay circuit.

15 Claims, 2 Drawing Sheets

(56) References Cited

U.S. PATENT DOCUMENTS

| | | | |
|---|---|---|---|
| 9,444,435 B1* | 9/2016 | Monaco | H03K 3/0322 |
| 9,490,826 B1 | 11/2016 | Wang | |
| 10,425,062 B2* | 9/2019 | Kato | H03H 11/12 |
| 10,963,002 B1* | 3/2021 | Hafizi | H03F 3/45475 |
| 11,258,436 B1* | 2/2022 | Lin | H03K 5/01 |
| 11,271,710 B1* | 3/2022 | Cho | H03B 27/00 |
| 11,550,354 B2* | 1/2023 | Chen | G06F 1/32 |
| 2006/0050821 A1 | 3/2006 | Ajjikuttira | |
| 2009/0180524 A1* | 7/2009 | Wang | H04B 1/7085 375/E1.002 |
| 2012/0092085 A1* | 4/2012 | Oishi | C07D 213/42 327/552 |
| 2014/0312989 A1* | 10/2014 | Stroet | H04B 15/02 333/172 |

* cited by examiner

US 11,811,413 B2

POLY PHASE FILTER WITH PHASE ERROR ENHANCE TECHNIQUE

CROSS REFERENCE TO RELATED APPLICATIONS

This application claims the benefit of U.S. Provisional Application No. 63/255,029, filed on Oct. 13, 2021. The content of the application is incorporated herein by reference.

BACKGROUND

In a conventional poly phase filter with multiple paths, each path has an adjustable delay circuit for controlling the phase of the corresponding output clock signal to make all the output clock signals of the polyphase filter have the appropriate phases. However, the mismatch between each path will greatly introduce large phase error.

SUMMARY

It is therefore an objective of the present invention to provide a poly phase filter with less adjustable delay circuits, to solve the above-mentioned problems.

According to one embodiment of the present invention, a filtering circuit comprising a poly phase filter and a quadrature phase detector is disclosed. The poly phase filter comprises a first path, a second path, a third path and a fourth path. The first path is configured to receive a first input signal to generate a first clock signal. The second path comprising a first adjustable delay circuit is configured to receive the first input signal to generate a second clock signal, wherein the first adjustable delay circuit is coupled to the first input signal and a second input signal, and the first input signal and the second input signal is a differential signal. The third path comprising a second adjustable delay circuit is configured to receive the second input signal to generate a third clock signal, wherein the second adjustable delay circuit is coupled to the first input signal and the second input signal. The fourth path is configured to receive the second input signal to generate a fourth clock signal. The quadrature phase detector is configured to detect phases of the first clock signal, the second clock signal, the third clock signal and the fourth clock signal to generate control signals to control the first adjustable delay circuit and the second adjustable delay circuit.

According to one embodiment of the present invention, a poly phase filter comprising a first path, a second path, a third path and a fourth path is disclosed. The first path is configured to receive a first input signal to generate a first clock signal. The second path comprising a first adjustable delay circuit is configured to receive the first input signal to generate a second clock signal, wherein the first adjustable delay circuit is coupled to the first input signal and a second input signal, and the first input signal and the second input signal is a differential signal. The third path comprising a second adjustable delay circuit is configured to receive the second input signal to generate a third clock signal, wherein the second adjustable delay circuit is coupled to the first input signal and the second input signal. The fourth path is configured to receive the second input signal to generate a fourth clock signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
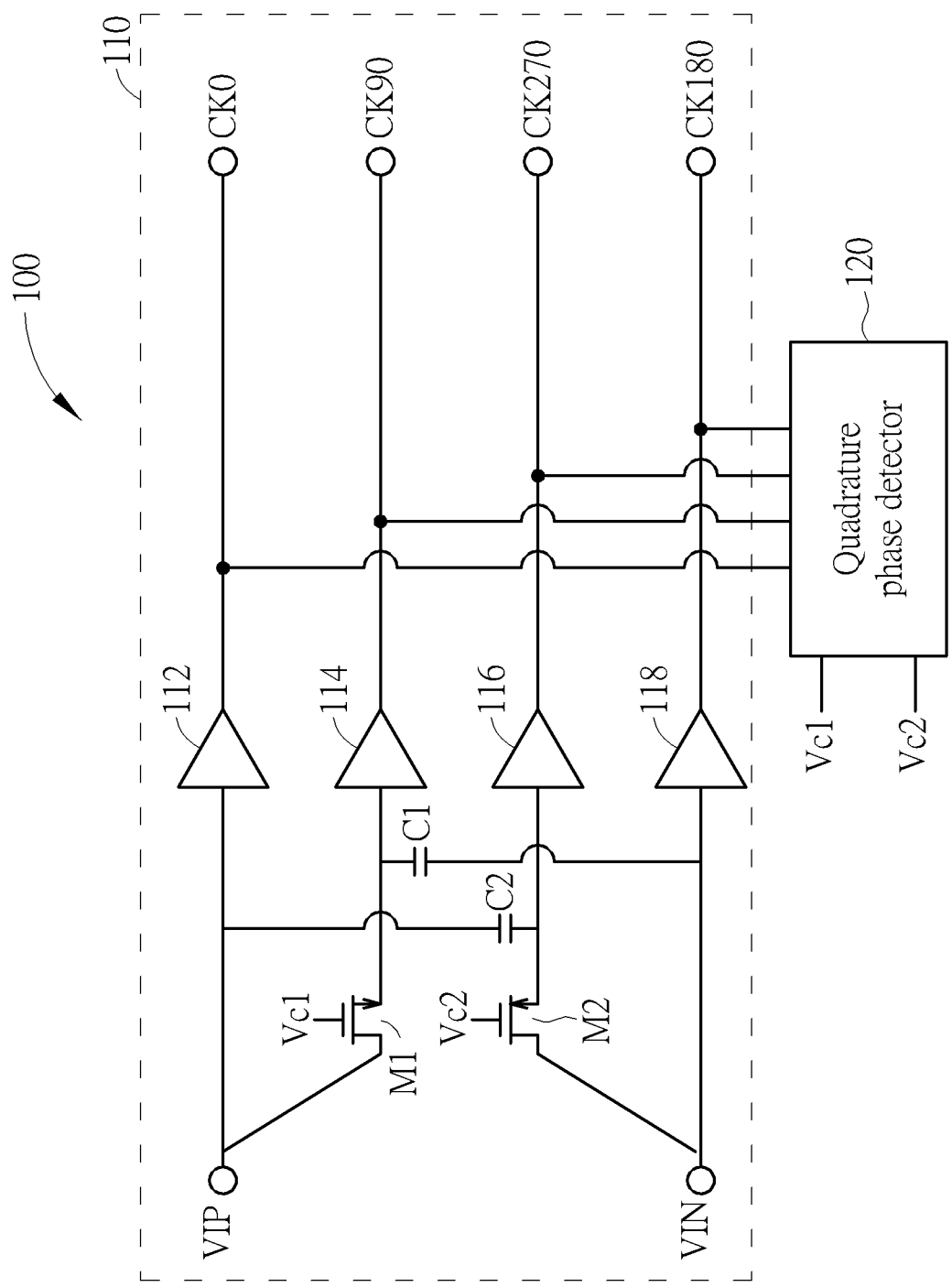
FIG. 1 is a diagram illustrating a filtering circuit comprising a poly phase filter and a quadrature phase detector according to one embodiment of the present invention.

FIG. 1 is a diagram illustrating a filtering circuit 100 according to one embodiment of the present invention. As shown in FIG. 1, the filtering circuit 100 comprises a poly phase filter 110 and a quadrature phase detector 120, wherein the poly phase filter 110 is configured to receive a differential input signal (clock signal) VIP and VIN to generate four clock signals CK0, CK90, CK180 and CK270 with ideal phases of 0 degree, 90 degrees, 180 degrees and 270 degrees, respectively, and the quadrature phase detector 120 is configured to detect phases of the clock signals CK0, CK90, CK180 and CK270 to generate control signals Vc1 and Vc2 to control the internal delay of the poly phase filter 110.

The polyphase filter 110 comprises four paths for generating the clock signals CK0, CK90, CK270 and CK180 with the same frequency, respectively. The first path comprises a buffer 112, and the buffer 112 receives the input signal VIP to generate the clock signal CK0, that is the input signal VIP serves as the clock signal CK0. The second path comprises an adjustable delay circuit (in this embodiment, a transistor M1 serves as the adjustable delay circuit), a capacitor C1 and a buffer 114, wherein a gate electrode of the transistor M1 is coupled to the control signal Vc1, a first electrode of the transistor M1 is coupled to the input signal VIP, a second electrode of the transistor M1 is used to generate the clock signal CK90 via the buffer 114, and the capacitor C1 is coupled between the second electrode of the transistor M1 and the input signal VIN. The third path comprises an adjustable delay circuit (in this embodiment, a transistor M2 serves as the adjustable delay circuit), a capacitor C2 and a buffer 116, wherein a gate electrode of the transistor M2 is coupled to the control signal Vc2, a first electrode of the transistor M2 is coupled to the input signal VIN, a second electrode of the transistor M2 is used to generate the clock signal CK270 via the buffer 116, and the capacitor C2 is coupled between the second electrode of the transistor M1 and the input signal VIP. The fourth path comprises a buffer 118, and the buffer 118 receives the input signal VIN to generate the clock signal CK180, that is the input signal VIN serves as the clock signal CK180.

In the polyphase filter 110 shown in FIG. 1, the input signal VIP serves as the clock signal CK0 directly, the transistor M1 and the capacitor C1 perform phase interpolation on the input signals VIP and VIN to generate the clock signal CK90, the transistor M2 and the capacitor C2 perform phase interpolation on the input signals VIP and VIN to generate the clock signal CK270, and the input signal VIN serves as the clock signal CK180 directly. Therefore, because the first path and the fourth path do not have any adjustable delay circuit, and only the second path and the third path have the adjustable delay circuits M1 and M2, the noise, power consumption and the mismatch of the poly phase filter 110 can be greatly improved.

Figure 2:
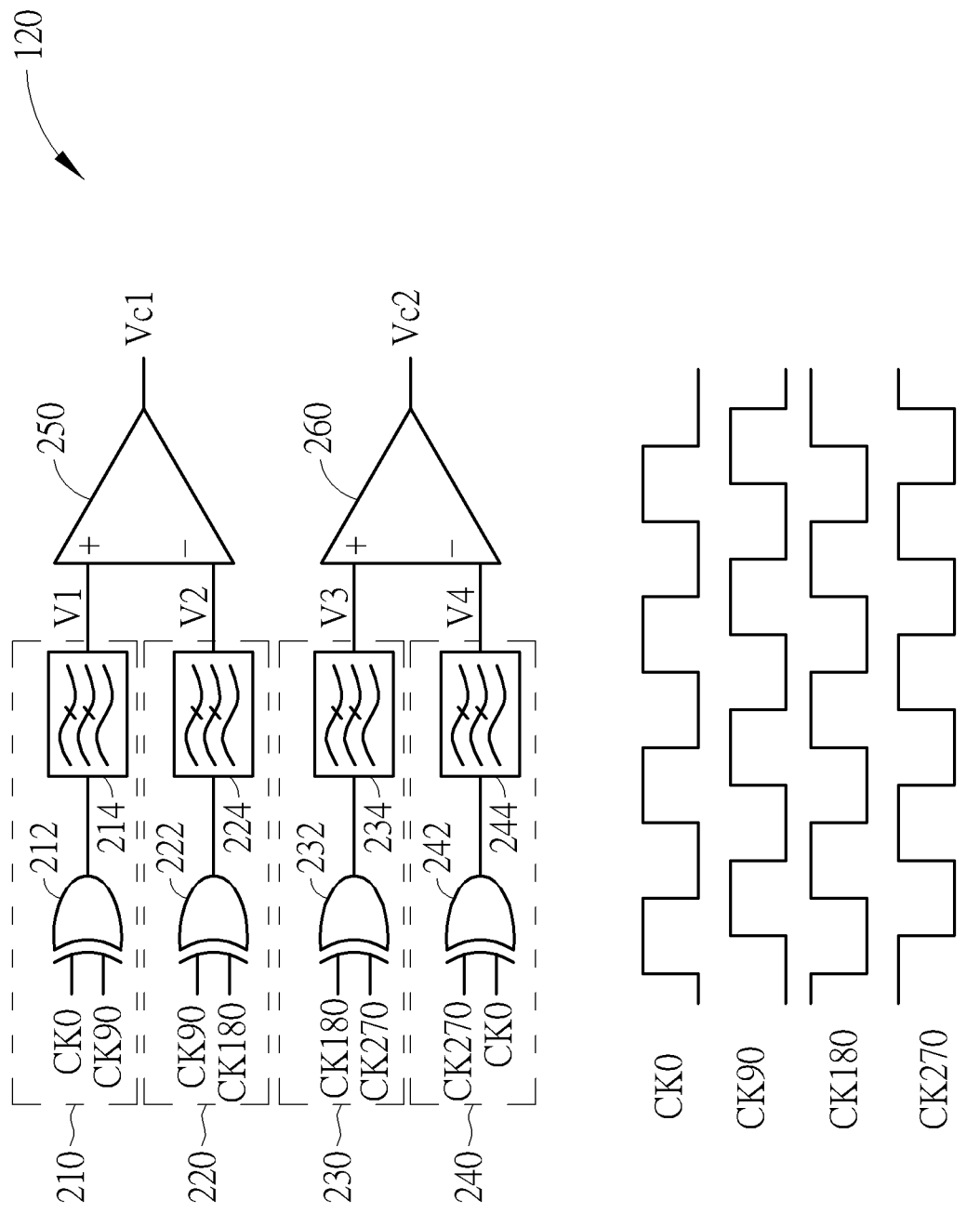
FIG. 2 is a diagram illustrating the quadrature phase detector according to one embodiment of the present invention.

FIG. 2 is a diagram illustrating the quadrature phase detector 120 according to one embodiment of the present invention. As shown in FIG. 2, the quadrature phase detector 120 comprises a first detection circuit 210, a second detection circuit 220, a third detection circuit 230, a fourth detection circuit 240, a first comparator 250 and a second comparator 260, wherein the first detection circuit 210 comprises an XOR gate 212 and a low-pass filter 214, the second detection circuit 220 comprises an XOR gate 222 and a low-pass filter 224, the third detection circuit 230 comprises an XOR gate 232 and a low-pass filter 234, and the fourth detection circuit 240 comprises an XOR gate 242 and a low-pass filter 244.

In the operation of the first detection circuit 210 of the quadrature phase detector 120, the XOR gate 212 receives the clock signals CK0 and CK90 to generate a first output signal, wherein the first output signal has a high voltage (i.e., a high voltage level of the clock signal CK0 or a supply voltage VDD) only when the clock signal CK0 has a high voltage level and the clock signal CK90 has a low voltage level, and the first output signal has a low voltage (e.g., ground voltage or 0V) when both the clock signal CK0 and the clock signal CK90 have the high voltage levels or the clock signal CK0 has the low voltage level. Since the first output signal has the high voltage only during quarter-cycle of the clock signal CK0/CK90, a first detection result V1 generated by filtering the first output signal is equal to $(¼)*VDD$ if the phase difference between the clock signals CK0 and CK90 is exactly equal to 90 degrees.

Regarding the operation of the second detection circuit 220, the XOR gate 222 receives the clock signals CK90 and CK180 to generate a second output signal, wherein the second output signal has a high voltage only when the clock signal CK90 has a high voltage level and the clock signal CK180 has a low voltage level, and the second output signal has a low voltage when both the clock signal CK90 and the clock signal CK180 have the high voltage levels or the clock signal CK90 has the low voltage level. Since the second output signal has the high voltage only during quarter-cycle of the clock signal CK90/CK180, a first detection result V2 generated by filtering the second output signal is equal to $(¼) *VDD$ if the phase difference between the clock signals CK90 and CK180 is exactly equal to 90 degrees.

Regarding the operation of the third detection circuit 230, the XOR gate 232 receives the clock signals CK180 and CK270 to generate a third output signal, wherein the third output signal has a high voltage only when the clock signal CK180 has a high voltage level and the clock signal CK270 has a low voltage level, and the third output signal has a low voltage when both the clock signal CK180 and the clock signal CK270 have the high voltage levels or the clock signal CK180 has the low voltage level. Since the third output signal has the high voltage only during quarter-cycle of the clock signal CK180/CK270, a third detection result V3 generated by filtering the third output signal is equal to $(¼)*VDD$ if the phase difference between the clock signals CK180 and CK270 is exactly equal to 90 degrees.

Regarding the operation of the fourth detection circuit 240, the XOR gate 242 receives the clock signals CK270 and CK0 to generate a fourth output signal, wherein the fourth output signal has a high voltage only when the clock signal CK270 has a high voltage level and the clock signal CK0 has a low voltage level, and the fourth output signal has a low voltage when both the clock signal CK270 and the clock signal CK0 have the high voltage levels or the clock signal CK270 has the low voltage level. Since the fourth output signal has the high voltage only during quarter-cycle of the clock signal CK270/CK0, a fourth detection result V4 generated by filtering the fourth output signal is equal to $(¼)*VDD$ if the phase difference between the clock signals CK270 and CK0 is exactly equal to 90 degrees.

Then, the first comparator 250 compares the first detection result V1 and the second detection result V2 to generate the control signal Vc1 to control the resistance of the transistor M1. Specifically, if the first detection result V1 is greater than the second detection result V2, it may indicate that the phase difference between the clock signals CK0 and CK90 is greater than the phase difference between the clock signals CK90 and CK180, then the first comparator 250 can generate the control signal Vc1 to lower the resistance of the transistor M1 to advance the phase of the clock signal CK90. If the first detection result V1 is less than the second detection result V2, it may indicate that the phase difference between the clock signals CK0 and CK90 is less than the phase difference between the clock signals CK90 and CK180, then the first comparator 250 can generate the control signal Vc1 to increase the resistance of the transistor M1 to delay the phase of the clock signal CK90.

Similarly, the second comparator 260 compares the third detection result V3 and the fourth detection result V4 to generate the control signal Vc2 to control the resistance of the transistor M2. Specifically, if the third detection result V3 is greater than the fourth detection result V4, it may indicate that the phase difference between the clock signals CK180 and CK270 is greater than the phase difference between the clock signals CK270 and CK0, then the second comparator 260 can generate the control signal Vc2 to lower the resistance of the transistor M2 to advance the phase of the clock signal CK270. If the third detection result V3 is less than the fourth detection result V4, it may indicate that the phase difference between the clock signals CK180 and CK270 is less than the phase difference between the clock signals CK270 and CK0, then the second comparator 260 can generate the control signal Vc2 to increase the resistance of the transistor M2 to delay the phase of the clock signal CK270.

By using the quadrature phase detector 120 shown in FIG. 2, the phases of the clock signals CK90 and CK270 can be controlled so that the phases of the clock signals CK90 and CK270 approach 90 degrees and 270 degrees, respectively.

It is noted that the detailed circuits within the quadrature phase detector 120 are for illustrative, not a limitation of the present invention. For example, the XOR gate 212/222/232/242 can be replaced by other logical circuit(s), and/or the first detection circuit 210, the second detection circuit 220 and the first comparator 250 can be combined to detect the phases of the clock signals CK0, CK90 and CK180 to generate the control circuit Vc1, and/or the third detection circuit 230, the fourth detection circuit 240 and the second comparator 260 can be combined to detect the phases of the clock signals CK180, CK270 and CK0 to generate the control signal Vc2. In other words, as long as the quadrature phase detector 120 can generate the control signal V1 based on the clock signals CK0, CK90 and CK180, and generate the control signal Vc2 based on the clock signals CK180, CK270 and CK0, the quadrature phase detector 120 can have different circuit designs inside.

Briefly summarized, in the poly phase filter of the present invention, the first path and the fourth path do not have any adjustable delay circuit, and only the second path and the third path have the adjustable delay circuits, therefore, the noise, power consumption and the mismatch of the poly phase filter can be greatly improved. In addition, by using the quadrature phase detector to detect the phases of the clock signals, the adjustable delay circuits of the second path and the third path can be controlled well so that the clock signals have the appropriate phases.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A filtering circuit, comprising:
   a poly phase filter, comprising:
      a first path, configured to receive a first input signal to generate a first clock signal;
      a second path comprising a first adjustable delay circuit, configured to receive the first input signal to generate a second clock signal, wherein the first adjustable delay circuit is coupled to the first input signal and a second input signal, and the first input signal and the second input signal is a differential signal;
      a third path comprising a second adjustable delay circuit, configured to receive the second input signal to generate a third clock signal, wherein the second adjustable delay circuit is coupled to the first input signal and the second input signal; and
      a fourth path, configured to receive the second input signal to generate a fourth clock signal; and
   a quadrature phase detector, configured to detect phases of the first clock signal, the second clock signal, the third clock signal and the fourth clock signal to generate control signals to control the first adjustable delay circuit and the second adjustable delay circuit;
   wherein the quadrature phase detector detects the phases of the first clock signal, the second clock signal and the fourth clock signal to generate a first control signal of the control signals to control the first adjustable delay circuit.

2. The filtering circuit of claim 1, wherein the first path does not have any adjustable delay circuit, and the fourth path does not have any adjustable circuit.

3. The filtering circuit of claim 1, wherein the first adjustable delay circuit has a first electrode and a second electrode, the first adjustable delay circuit receives the first input signal at the first electrode, and outputs the second clock signal at the second electrode; and the second electrode of the first adjustable delay circuit is coupled to the second input signal via a first capacitor.

4. The filtering circuit of claim 3, wherein the second adjustable delay circuit has a first electrode and a second electrode, the second adjustable delay circuit receives the second input signal at the first electrode, and outputs the third clock signal at the second electrode; and the second electrode of the second adjustable delay circuit is coupled to the first input signal via a second capacitor.

5. The filtering circuit of claim 1, wherein the quadrature phase detector detects the phases of the first clock signal, the third clock signal and the fourth clock signal to generate a second control signal of the control signals to control the second adjustable delay circuit.

6. The filtering circuit of claim 5, wherein the first clock signal, the second clock signal, the third clock signal and the fourth clock signal correspond to phases of 0 degree, 90 degrees, 270 degrees and 180 degrees, respectively.

7. The filtering circuit of claim 5, wherein the quadrature phase detector comprises:
   a first detection circuit, configured to detect a phase difference between the first clock signal and the second clock signal to generate a first detection result;
   a second detection circuit, configured to detect a phase difference between the second clock signal and the fourth clock signal to generate a second detection result;
   a third detection circuit, configured to detect a phase difference between the third clock signal and the fourth clock signal to generate a third detection result;
   a fourth detection circuit, configured to detect a phase difference between the third clock signal and the first clock signal to generate a fourth detection result;
   a first comparator, configured to compare the first detection result and the second detection result to generate the first control signal; and
   a second comparator, configured to compare the third detection result and the fourth detection result to generate the second control signal.

8. A poly phase filter, comprising:
   a first path, configured to receive a first input signal to generate a first clock signal;
   a second path comprising a first adjustable delay circuit, configured to receive the first input signal to generate a second clock signal, wherein the first adjustable delay circuit is coupled to the first input signal and a second input signal, and the first input signal and the second input signal is a differential signal;
   a third path comprising a second adjustable delay circuit, configured to receive the second input signal to generate a third clock signal, wherein the second adjustable delay circuit is coupled to the first input signal and the second input signal; and
   a fourth path, configured to receive the second input signal to generate a fourth clock signal;
   wherein the first path does not have any adjustable delay circuit, and the fourth path does not have any adjustable circuit.

9. The poly phase filter of claim 8, wherein the first clock signal, the second clock signal, the third clock signal and the fourth clock signal correspond to phases of 0 degree, 90 degrees, 270 degrees and 180 degrees, respectively.

10. A poly phase filter, comprising:
    a first path, configured to receive a first input signal to generate a first clock signal;
    a second path comprising a first adjustable delay circuit, configured to receive the first input signal to generate a second clock signal, wherein the first adjustable delay circuit is coupled to the first input signal and a second input signal, and the first input signal and the second input signal is a differential signal;
    a third path comprising a second adjustable delay circuit, configured to receive the second input signal to generate a third clock signal, wherein the second adjustable delay circuit is coupled to the first input signal and the second input signal; and a fourth path, configured to receive the second input signal to generate a fourth clock signal;

wherein the first adjustable delay circuit has a first electrode and a second electrode, the first adjustable delay circuit receives the first input signal at the first electrode, and outputs the second clock signal at the second electrode; and the second electrode of the first adjustable delay circuit is coupled to the second input signal via a first capacitor.

11. The poly phase filter of claim 10, wherein the first path does not have any adjustable delay circuit, and the fourth path does not have any adjustable circuit.

12. The poly phase filter of claim 10, wherein the first clock signal, the second clock signal, the third clock signal and the fourth clock signal correspond to phases of 0 degree, 90 degrees, 270 degrees and 180 degrees, respectively.

13. A poly phase filter, comprising:

a first path, configured to receive a first input signal to generate a first clock signal;

a second path comprising a first adjustable delay circuit, configured to receive the first input signal to generate a second clock signal, wherein the first adjustable delay circuit is coupled to the first input signal and a second input signal, and the first input signal and the second input signal is a differential signal;

a third path comprising a second adjustable delay circuit, configured to receive the second input signal to generate a third clock signal, wherein the second adjustable delay circuit is coupled to the first input signal and the second input signal; and a fourth path, configured to receive the second input signal to generate a fourth clock signal;

wherein the second adjustable delay circuit has a first electrode and a second electrode, the second adjustable delay circuit receives the second input signal at the first electrode, and outputs the third clock signal at the second electrode; and the second electrode of the second adjustable delay circuit is coupled to the first input signal via a second capacitor.

14. The poly phase filter of claim 13, wherein the first path does not have any adjustable delay circuit, and the fourth path does not have any adjustable circuit.

15. The poly phase filter of claim 13, wherein the first clock signal, the second clock signal, the third clock signal and the fourth clock signal correspond to phases of 0 degree, 90 degrees, 270 degrees and 180 degrees, respectively.

* * * * *